United States Patent [19]

Goto et al.

[11] Patent Number: 5,006,852

[45] Date of Patent: Apr. 9, 1991

[54] ANALOG-TO-DIGITAL CONVERTER WITH ISOLATED POWER SUPPLY LINES TO THE INDIVIDUAL COMPONENTS

[75] Inventors: Junkei Goto, Kawasaki; Tetsuya Iida, Yokohama, both of Japan

[73] Assignee: Kabushiki Kaisha Toshiba, Kawasaki, Japan

[21] Appl. No.: 355,609

[22] Filed: May 23, 1989

[30] Foreign Application Priority Data

May 25, 1988 [JP] Japan ................................ 63-127414

[51] Int. Cl.$^5$ .............................................. H03M 1/00
[52] U.S. Cl. ..................................... 341/155; 341/158; 341/161
[58] Field of Search ............... 341/118, 119, 120, 144, 341/155, 158, 159, 161, 162, 163, 164

[56] References Cited

U.S. PATENT DOCUMENTS 4,556,870 12/1985 Brokaw et al. ...................... 341/119
4,746,900 5/1988 Shibuya et al. ...................... 341/167

Primary Examiner—A. D. Pellinen
Assistant Examiner—H. L. Williams
Attorney, Agent, or Firm—Finnegan, Henderson, Farabow, Garrett and Dunner

[57] ABSTRACT

This invention discloses an analog-to-digital converter. Current supply paths are branched at the current supply terminals from the other current paths so as to be connected exclusively to the analog voltage comparator. And a circuit block of the analog voltage comparator is positioned closer to the current supply terminals than the other circuit block of DA converter, sequential comparison register, etc.

15 Claims, 3 Drawing Sheets

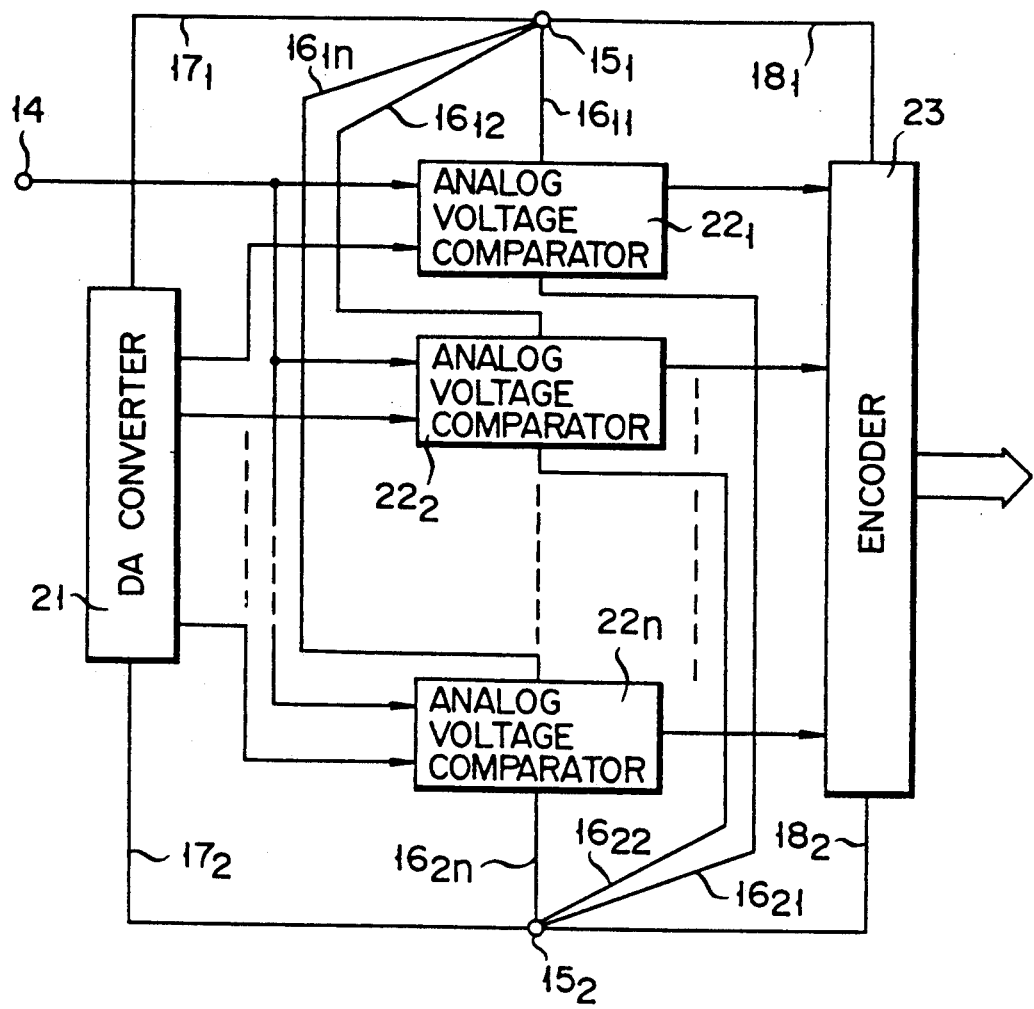
F I G. 3
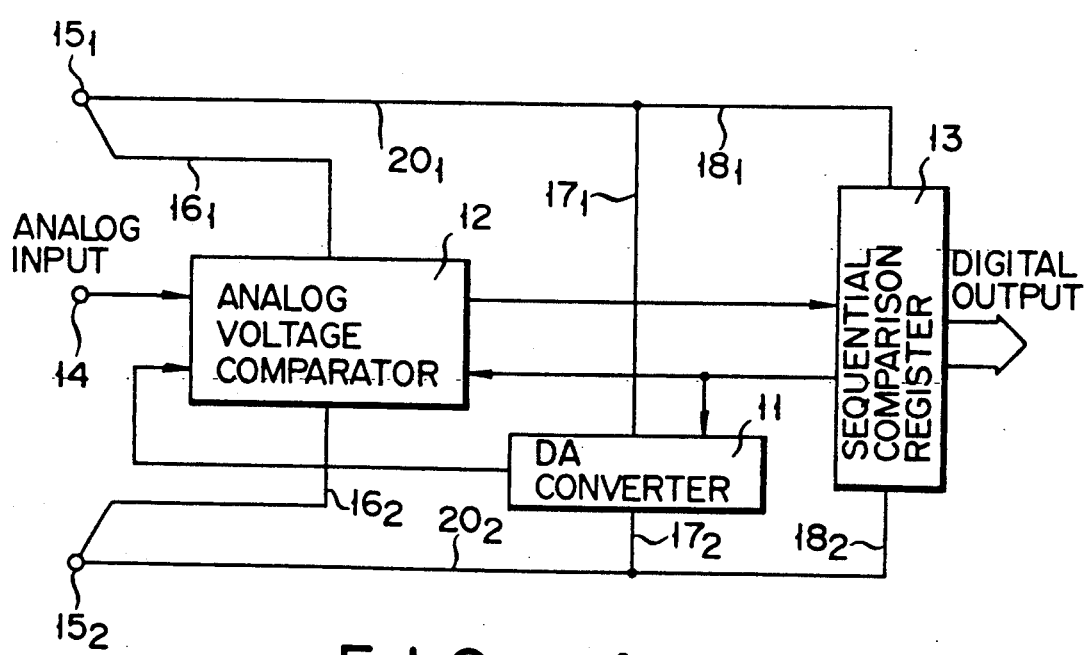
F I G. 4

ANALOG-TO-DIGITAL CONVERTER WITH ISOLATED POWER SUPPLY LINES TO THE INDIVIDUAL COMPONENTS

BACKGROUND OF THE INVENTION

1. Field of the Invention

The present invention relates to an analog-to-digital converter (hereinafter referred to as "AD converter") formed within a semiconductor integrated circuit, particularly, to an AD converter in which a current supply path is provided exclusively for each constituent block of the AD converter and an analog voltage comparator, which is one of said constituent blocks, is positioned closer to the current supply terminal than the other constituent blocks.

2. Description of the Related Art

AD converters of various types are known to the art including, for example, the integration type, flush type and sequential comparison type, which are described in, for example, ANDREW G. F. DINGWALL (RCA Laboratories), "Monolithic Expandable 6 Bit 20 MHz CMOS/SOS/ A/D Converter" IEEE J of S.S.C. Vol. SC-14, No. 6P926-932; August, 1979. These AD converters comprise a DA converter for producing a reference voltage, an analog voltage comparator for comparing an analog input voltage with the reference voltage or a group of analog voltage comparators and, as desired, a control circuit for controlling the DA converter and the analog voltage comparator.

In the conventional AD converter formed in a chip of a semiconductor integrated circuit, current is supplied from the current supply terminal of a power source to the control circuit for controlling the analog voltage comparator or comparators and the DA converter via a common current supply path. For example, the conventional AD converter is constructed as shown in FIG. 1. As seen from the drawing, an analog voltage 3, a DA converter 4, a control circuit 5 (in this case, a sequential comparative register), and common current supply paths 6, 7 are provided between current supply terminals 1 and 2.

In the AD converter, it is important for the analog voltage comparator to perform comparison accurately between the reference voltage and the analog input voltage. In the prior art shown in FIG. 1, however, a change in current within the DA converter 4 and a control circuit, which accompanies the switching operation of the DA converter 4 and the control circuit, gives an influence to the analog voltage comparator 3 via the current supply paths 6, 7. As a result, the comparing operation of the analog voltage comparator 3 becomes unstable, leading to a low accuracy in the AD conversion.

In forming an AD converter on a chip of a semiconductor integrated circuit, no special attention was paid in the past to the locational relationship between the circuit block of the analog voltage comparator 3 and the other circuit blocks such as the circuit block of the DA converter 4. It should be noted in this connection that the current supply paths 6, 7 leading from the current supply terminals 1, 2 to the analog voltage comparator 3 become the longer, as the distance of the comparator 3 from the terminals 1, 2 becomes the longer, resulting in an increased parasitic inductance of the current paths 6 and 7. It follows that a change in voltage is increased when current flows through these current supply paths 6, 7. It should be noted that the operation of the analog voltage comparator 3 is likely to be affected by, particularly, a change in the power source voltage. Naturally, a big change in voltage caused by the parasitic inductance noted above leads to an unstable operation of the analog voltage comparator 3.

SUMMARY OF THE INVENTION

As described above, the conventional AD converter is constructed such that the power source current is supplied to the analog voltage comparator and other constituents of the AD converter such as the DA converter through common current supply paths leading from the current supply terminals. The particular construction brings about an unstable operation of the analog voltage comparator, leading to a low AD conversion accuracy.

The present invention is intended to overcome the above-noted problem inherent in the prior art, and provides an AD converter which permits the analog voltage comparator to operate stably, leading to an improved AD conversion accuracy.

According to the present invention, there is provided an AD converter formed on a semiconductor integrated circuit chip, comprising a DA converter generating a reference voltage, and an analog voltage comparator or comparators for comparing the reference voltage with an analog voltage input, wherein the current supply path leading from the current supply terminals to the DA converter and the analog voltage comparator or comparators is branched into a plurality of current supply paths, and a pair of current supply paths among the branched paths are allotted exclusively to the analog voltage comparator or comparators.

Since the current supply path allotted to the analog voltage comparator or comparators is branched from the other current supply paths leading from the current supply terminals to the other constituent blocks of the AD converter, the analog voltage comparator or comparators are unlikely to be affected by, for example, the switching noise of the DA converter connected to the other current supply paths. It follows that the AD converter of the present invention is capable of achieving the AD conversion with a high accuracy.

BRIEF DESCRIPTION OF THE DRAWINGS

FIGS. 2 to 5 are block diagrams each showing an AD converter according to the present invention.

DETAILED DESCRIPTION OF THE PREFERRED EMBODIMENTS

Figure 1:
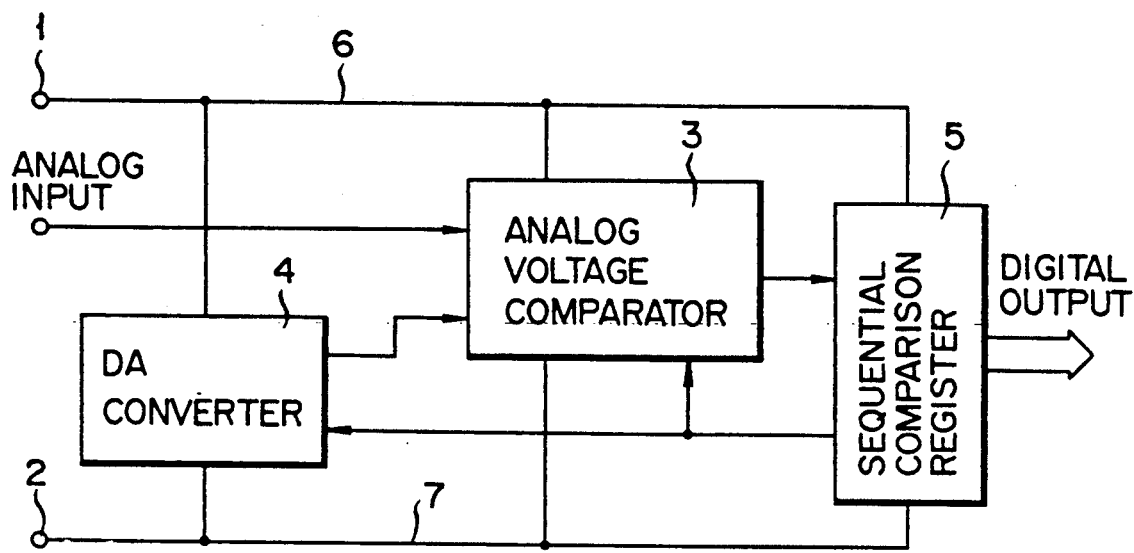
FIG. 1 is a block diagram showing the conventional AD converter.
Figure 2:
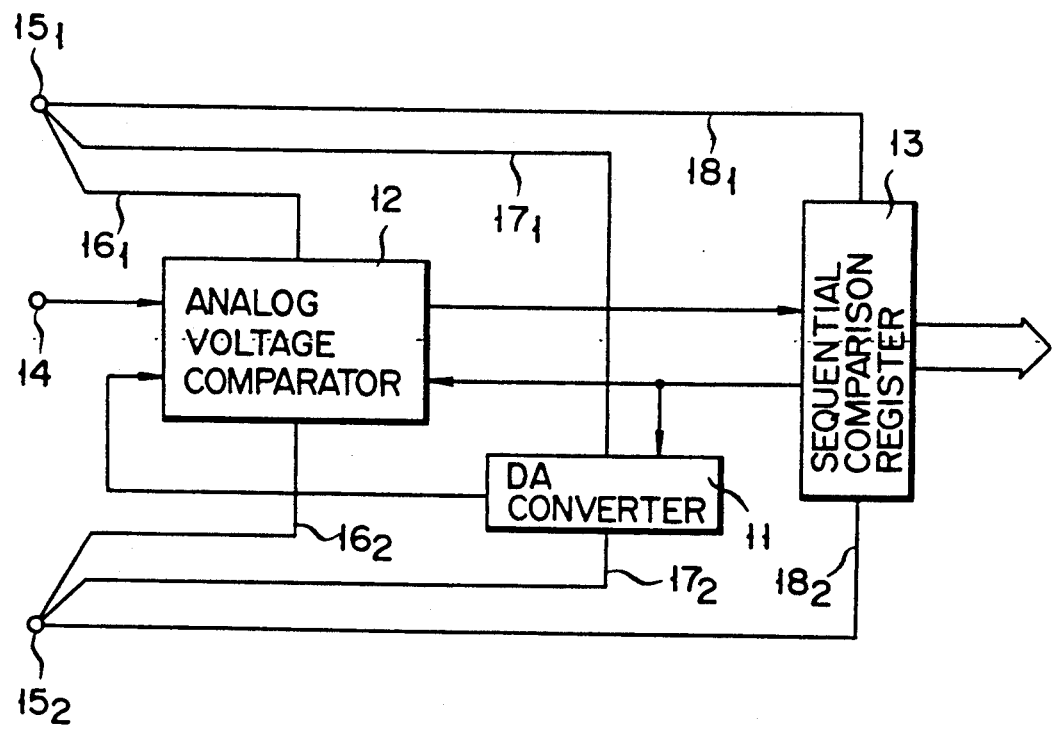

FIG. 2 shows a sequential comparison type AD converter according to one embodiment of the present invention. The AD converter is formed on a semiconductor integrated circuit chip. As seen from the drawing, the AD converter comprises a DA converter 12 generating a reference voltage, an analog voltage comparator 12 for comparing the reference voltage with an analog voltage input, a sequential comparison register 13 for controlling the DA converter 11 and the analog voltage comparator 12, a signal input terminal (pad) 14 to which an analog voltage is supplied, a pair of current supply terminals (pads) $15_1$ and $15_2$ for supplying the power source current to the DA converter 11, analog voltage comparator 12, sequential comparison register 13, etc. and current supply paths $16_1$ to $18_1$ and $16_2$ to $18_2$ connecting the pair of current supply terminals $15_1$ and $15_2$ to the internal circuits such as the analog voltage comparator 12, DA converter 11 and sequential comparison register 13. These current supply paths $16_1$ to $18_1$ and $16_2$ to $18_2$ are formed of an aluminum wiring film. It should be noted that the current supply paths $16_1$ and $16_2$ are branched at the current supply terminals $15_1$ and $15_2$ from the other current supply paths $17_1$, $18_1$ and $17_2$, $18_2$ so as to be connected exclusively to the analog voltage comparator 12. It should also be noted that the circuit block of the analog voltage comparator 12 is positioned closer to the current supply terminals $15_1$, $15_2$ than the other circuit blocks of the DA converter 11, sequential comparison register 13, etc. Naturally, the current supply paths $16_1$, $16_2$ connected to the analog voltage comparator 12 are shorter than the other current supply paths $17_1$, $18_1$ and $17_2$, $18_2$.

Incidentally, it is possible for the current supply paths $16_1$, $16_2$ to have a width larger than that of the other current supply paths $17_1$, $18_1$ and $17_2$, $18_2$.

In the AD converter shown in FIG. 2, the current supply paths $16_1$, $16_2$ exclusively connected to the analog voltage comparator 12 are branched at the current supply terminals $15_1$, $15_2$ from the other current supply paths. As a result, the AD converter is unlikely to be affected by, for example, the switching noise of the DA converter connected to the other current supply paths It follows that the analog voltage comparator 12 is enabled to perform a stable operation, leading to AD conversion of high accuracy.

It should also be noted that the current supply paths $16_1$, $16_2$ exclusively connected to the analog voltage comparator 12 are shorter than the other current supply paths. Naturally, the current supply paths $16_1$, $16_2$ have a small parasitic inductance so as to diminish the change in the power source voltage applied to the analog voltage comparator 12 when current flows through these current supply paths $16_1$, $16_2$. Thus, the operation stability of, particularly, the analog voltage comparator 12, which is weak against the change in the power source voltage, can be improved, leading to further improvement in the accuracy of the AD conversion.

Incidentally, the similar effects can be obtained in the case where the current supply paths $16_1$, $16_2$ have a width larger than that of the other current supply paths $17_1$, $18_1$ and $17_2$, $18_2$.

FIG. 3 shows another embodiment of the present invention. This embodiment is directed to a parallel comparison type AD converter. As seen from the drawing, the AD converter comprises a DA converter 21 generating reference voltage of n-stage levels, n-number of analog voltage comparators $22_1$ to $22_n$, and an encoder 23 for encoding the outputs of the comparators $22_1$ to $22_n$ so as to generate a digital output. In this embodiment, the current supply paths $16_{11}$ to $16_{1n}$ and $16_{21}$ to $16_{2n}$ allotted exclusively to the analog voltage comparators $22_1$ to $22_n$ are branched at the current supply terminals $15_1$, $15_2$ from the current supply paths $17_1$, $18_1$ and $17_2$, $18_2$ connected to the other internal circuits such as the DA converter 21 and the encoder 23, as in the embodiment of FIG. 2. Also, the circuit blocks for the analog voltage comparators $22_1$ to $22_n$ are positioned closer to the the current supply terminals $15_1$, $15_2$ than the other circuit blocks, with the result that the current supply paths $16_{11}$ to $16_{1n}$ and $16_{21}$ to $16_{2n}$ have a small parasitic inductance. It follows that the AD converter shown in FIG. 3 is substantially equal in its produced effects to the AD converter shown in FIG. 2. It should also be noted that even if the current supply paths $16_{11}$ to $16_{1n}$ and $16_{21}$ to $16_{2n}$ have a width larger than that of the other current supply paths $17_1$, $18_1$ and $17_2$, obtained in the case where the circuit blocks for the analog voltage comparators $22_1$ to $22_n$ are positioned closer to the current supply terminals $15_1$, $15_2$ than the other circuit blocks.

FIG. 4 shows an AD converter according to another embodiment of the present invention. In this embodiment, the current supply paths $16_1$, $16_2$ and current supply paths $20_1$, $20_2$ are branched at the current supply terminals $15_1$, $15_2$. Further, the current supply paths $17_1$, $17_2$ and $18_1$, $18_2$ are branched from the current supply paths $20_1$, $20_2$. Further, the analog voltage comparator 12 is positioned closer to the current supply terminals $15_1$, $15_2$ than the DA converter 11 and the sequential comparison register 13, as in the embodiment shown in FIG. 2.

Figure 5:
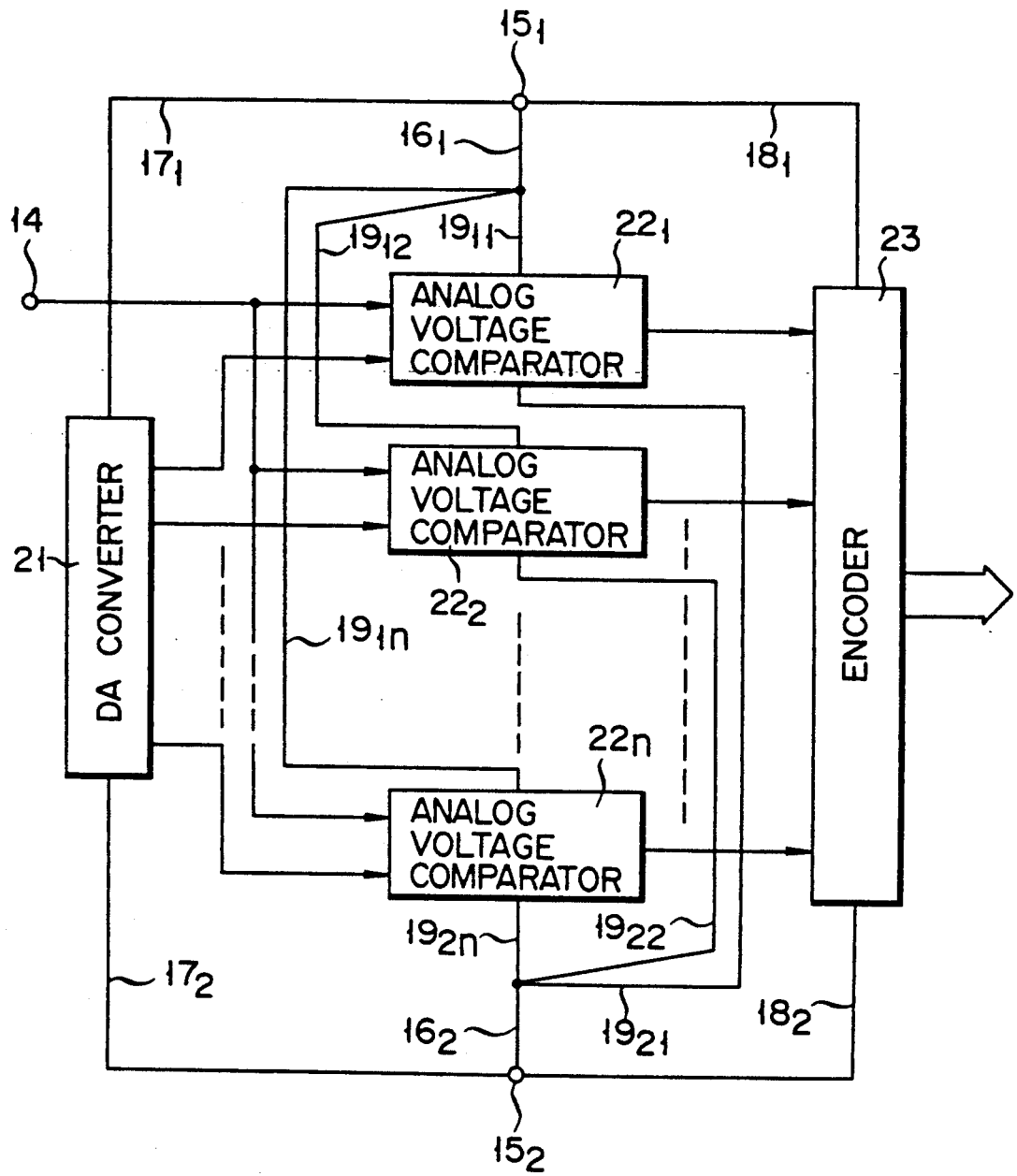

FIG. 5 shows still another embodiment of the present invention. In this embodiment, the current supply paths $16_1$, $16_2$, $17_1$, $17_2$ and $18_1$, $18_2$ are branched at the current supply terminals $15_1$, $15_2$. Further, the current supply paths $16_1$, $16_2$ are branched into a plurality of current supply paths $19_{11}$, $19_{12}$, ..., $19_{1n}$, $19_{21}$, $19_{22}$, ..., $19_{2n}$.

What is claimed is:

1. An analog-to-digital converter, comprising:
    first and second current supply terminal means for providing a power source current to said analog-to-digital converter;
    input terminal means for providing an analog voltage input;
    digital-to-analog converter means for providing a reference signal;
    comparator means coupled to the input terminal means and to the digital-to-analog converter means for comparing the analog voltage input with the reference signal to generate a digital comparison signal;
    control means coupled to the comparator means and to the digital-to-analog converter means, including means for providing a digital output signal in response to the digital comparison signal, and including means for providing a digital control signal to the comparator means and the digital-to-analog converter means;
    a first current supply path coupled between the comparator means and the first and second current supply terminal means, for providing a power source current to the comparator means;
    a second current supply path coupled between the digital-to-analog means and the first and second current supply terminal means, for providing a power source current to the digital-to-analog converter means; and
    a third current supply path coupled between the control means and the first and second current supply terminal means, for providing a power source current to the control means;
    wherein said first, second, and third current supply paths are electrically isolated from one another except at the first and second current supply terminal means.

2. The analog-to-digital converter according to claim 1, wherein the first current supply path is shorter than either one of the second and third current supply paths.

3. The analog-to-digital converter according to claim 1, wherein the cross sectional area of the first current supply path is greater than that of either one of the second and third current supply paths.

4. The analog-to-digital converter according to claim 1, wherein the impedance of the first current supply path is less than that of either one of the second and third current supply paths.

5. An analog-to-digital converter, comprising:
first and second current supply terminal means for providing a power source current;
input terminal means for providing an analog voltage input;
digital-to-analog converter means for providing a reference signal;
comparator means coupled to the input terminal means and to the digital-to-analog converter means for comparing the analog voltage input with the reference signal to generate a digital comparison signal;
control means coupled to the comparator means and to the digital-to-analog converter means, including means for providing a digital output signal in response to the digital comparison signal, and including means for providing a digital control signal to the comparator means and the digital-to-analog converter means;
a first current supply path coupled between the comparator means the first and second current supply terminal means, for providing a power source current to the comparator means;
a second current supply path coupled between a pair of branching-off points and the first and second current supply terminal means;
a third current supply path coupled between the pair of branching-off points and the digital-to-analog converter means, for providing a power source current to the digital-to-analog converter means; and
a fourth current supply path coupled between the pair of branching-off points and the control means, for providing a power source current to the control means;
wherein said first and second current supply paths are electrically isolated from one another except at the first and second current supply terminal means and the third and fourth current supply paths are isolated from one another except at the pair of branching-off points.

6. The analog-to-digital converter according to claim 5, wherein the length of the first current supply path is smaller than the sum of the lengths of the second and third current supply paths, and is smaller than the sum of the lengths of the second and fourth current supply paths.

7. The analog-to-digital converter according to claim 5, wherein the cross sectional area of the first current supply path is greater than the sum of the cross sectional areas of the second and third current supply paths, and is greater than the sum of the cross sectional areas of the second and fourth current supply paths.

8. The analog-to-digital converter according to claim 5, wherein the first current supply path has an impedance less than the sum of the impedances of the second and third current supply paths, and less than the sum of the impedances of the second and fourth current supply paths.

9. An analog-to-digital converter, comprising:
first and second current supply terminal means for providing a power source current to said analog-to-digital converter;
input terminal means for providing an analog voltage input;
digital-to-analog converter means for providing a plurality of reference signals;
a plurality of comparator means coupled to the input terminal means and to the digital-to-analog converter means, each comparator means for comparing the analog voltage input with a respective one of the plurality of reference signals to generate a respective digital comparison signal;
encoding means coupled to the plurality of comparator means for providing a digital output signal in response to the digital comparison signals;
a plurality of first current supply paths, each first current path coupled between a respective one of the plurality of comparator means and the first and second current supply terminal means for providing a power source current to said each comparator means;
a second current supply path coupled between the digital-to-analog means and the first and second current supply terminal means, for providing a power source current to the digital-to-analog converter means; and
a third current supply path coupled between the control means and the first and second current supply terminal means, for providing a power source current to the encoding means, each one of said first current supply paths;
wherein said first, second, and third current supply paths are electrically isolated from one another except at the first and second current supply terminal means.

10. An analog-to-digital converter, comprising:
first and second current supply terminal means for providing a power source current;
input terminal means for providing an analog voltage input;
digital-to-analog converter means for providing a plurality of reference signals;
a plurality of comparator means coupled to the input terminal means and to the digital-to-analog converter means, each comparator means for comparing the analog voltage input with a respective one of the reference signals to generate a respective digital comparison signal;
encoding means for producing a digital output signal in response to generated digital comparison signals;
a first current supply paths path coupled between a pair of branching-off points and the first and second current supply terminal means;
a second current supply path coupled between the control means and the first and second current supply terminal means, for providing a power source current to the digital-to-analog converter means;
a third current supply path coupled between the encoding means and the first and second current supply terminal means, for providing a power source current to the encoding means; and
a plurality of fourth current supply paths, each path coupled between said branching-off points and a respective comparator means for providing a power source current to respective comparator means;

wherein the first, second and third current supply paths, and each one of the fourth current supply paths are electrically isolated from one another except at the first and second current supply terminal means.

11. An analog-to-digital converter, comprising:

first and second current supply terminal means for providing a power source current to said analog-to-digital converter;

input terminal means for providing an analog voltage input;

digital-to-analog converter means for providing a reference signal;

comparator means coupled to the input terminal means and to the digital-to-analog converter means for comparing the analog voltage input with the reference signal to generate a digital comparison signal;

control means coupled to the comparator means and to the digital-to-analog converter means, including means for providing a digital output signal in response to the digital comparison signal, and including means for providing a digital control signal to the comparator means and the digital-to-analog converter means;

a first current supply path coupled between the control means and the first and second current supply terminal means, for providing a power source current to the comparator means;

a second current supply path coupled between the digital-to-analog converter means and the first and second current supply terminal means, for providing a power source current to the digital-to-analog converter means; and a third current supply path coupled between the control means and the current supply terminal means, for providing a power source current to the control means;

wherein said first, second, and third current supply paths are electrically isolated from one another except at the first and second current supply terminal means, and the first current supply path is shorter than either one of the second and third current supply paths.

12. An analog-to-digital converter, comprising:

first and second current supply terminal means for providing a power source current to said analog-to-digital converter;

input terminal means for providing an analog voltage input;

digital-to-analog converter means for providing a reference signal;

comparator means coupled to the input terminal means and to the digital-to-analog converter means for comparing the analog voltage input with the reference signal to generate a digital comparison signal;

control means coupled to the comparator means and to the digital-to-analog converter means, including means for providing a digital output signal in response to the digital comparison signal, and including means for providing a digital control signal to the comparator means and the digital-to-analog converter means;

a first current supply path coupled between the control means and the first and second current supply terminal means, for providing a power source current to the comparator means;

a second current supply path coupled between the digital-to-analog converter means and the first and second current supply terminal means, for providing a power source current to the digital-to-analog converter means; and a third current supply path coupled between the control means and the current supply terminal means, for providing a power source current to the control means;

wherein said first, second, and third current supply paths are electrically isolated from one another except at the first and second current supply terminal means, and the cross sectional area of the first current supply path is greater than that of either one of the second and third current supply paths.

13. An analog-to-digital converter, comprising:

first and second current supply terminal means for providing a power source current to said analog-to-digital converter;

input terminal means for providing an analog voltage input;

digital-to-analog converter means for providing a reference signal;

comparator means coupled to the input terminal means and to the digital-to-analog converter means for comparing the analog voltage input with the reference signal to generate a digital comparison signal;

control means coupled to the comparator means and to the digital-to-analog converter means, including means for providing a digital output signal in response to the digital comparison signal, and including means for providing a digital control signal to the comparator means and the digital-to-analog converter means;

a first current supply path coupled between the control means and the first and second current supply terminal means, for providing a power source current to the comparator means;

a second current supply path coupled between the digital-to-analog converter means and the first and second current supply terminal means, for providing a power source current to the digital-to-analog converter means; and a third current supply path coupled between the control means and the current supply terminal means, for providing a power source current to the control means;

wherein said first, second, and third current supply paths is electrically isolated from one another except at the first and second current supply terminal means, and the impedance of the first current supply path is less than that of either one of the second and third current supply paths.

14. An analog-to-digital converter, comprising:

first and second current supply terminal means for providing a power source current;

input terminal means for providing an analog voltage input;

digital-to-analog converter means for providing a reference signal;

comparator means coupled to the input terminal means and to the digital-to-analog converter means for comparing a provided analog voltage input with a provided reference signal to generate a digital comparison signal;

control means coupled to the comparator means and the digital-to-analog converter means including means for providing a digital output signal in response to a generated digital comparison signal, and including means for providing a digital control signal to the comparator means and the digital-to-analog converter means;

a first current supply path coupled between the coupled means and the first and second current supply terminal means, for providing a power source current to the comparator means;

a second current supply path between a pair of branching-off points and the first and second current supply terminal means;

a third current supply path coupled between the branching-off points and the digital-to-analog converter means for providing a power source current to the digital-to-analog converter means; and a fourth current supply path coupled between said pair of branching-off points and the control means for providing a power source current to the control means;

wherein said first, second, third and fourth current supply paths are electrically isolated from one another except at the first and second terminal means, the length of the first current supply path is smaller than the sum of the lengths of the second and third current supply paths, and is smaller than the sum of the lengths of the second and fourth current supply paths, and the cross sectional area of the first current supply path is greater than the sum of the cross sectional areas of the second and third current supply paths, and is greater than the sum of the cross sectional areas of the second and fourth current supply paths.

15. An analog-to-digital converter, comprising:

first and second current supply terminal means for providing a power source current;

input terminal means for providing an analog voltage input;

digital-to-analog converter means for providing a reference signal;

comparator means coupled to the input terminal means and to the digital-to-analog converter means for comparing a provided analog voltage input with a provided reference signal to generate a digital comparison signal;

control means coupled to the comparator means and the digital-to-analog converter means including means for providing a digital output signal in response to a generated digital comparison signal, and including means for providing a digital control signal to the comparator means and the digital-to-analog converter means;

a first current supply path coupled between the control means and the first and second current supply terminal means, for providing a power source current to the comparator means;

a second current supply path between a pair of branching-off points and the first and second current supply terminal means;

a third current supply path coupled between the branching-off points and the digital-to-analog converter means for providing a power source current to the digital-to-analog converter means; and a fourth current supply path coupled between said pair of branching-off points and the control means for providing a power source current to the control means;

wherein said first, second, third and fourth current supply paths are electrically isolated from one another except at the first and second terminal means, the impedance of the first current supply path is less than the sum of impedance of the second and third current supply paths, and is less than the sum of the impedances of the second and fourth current supply paths.

* * * * *

UNITED STATES PATENT AND TRADEMARK OFFICE
CERTIFICATE OF CORRECTION

PATENT NO. : 5,006,852
DATED     : April 09, 1991
INVENTOR(S) : Junkei Goto et al.

It is certified that error appears in the above-identified patent and that said Letters Patent is hereby corrected as shown below:

Claim 5, column 5, line 28, after "means" insert --and--.

Claim 10, column 6, line 52, after "supply" delete --paths--.

Claim 13, column 8, line 50, after "paths" change "is" to --are--.

Claim 14, column 9, line 6, change "coupled means" to --control means--.

Claim 15, column 10, line 34, change "impedance" to --impedances--.

Signed and Sealed this

Twenty-fifth Day of May, 1993

Attest:

MICHAEL K. KIRK

Attesting Officer

Acting Commissioner of Patents and Trademarks